(12) United States Patent
Park et al.

(10) Patent No.: US 6,836,138 B1
(45) Date of Patent: Dec. 28, 2004

(54) MODULE HAVING TEST ARCHITECTURE FOR FACILITATING THE TESTING OF BALL GRID ARRAY PACKAGES, AND TEST METHOD USING THE SAME

(75) Inventors: Sung-Joo Park, Anyang (KR); Byung-Se So, Seongnam (KR); Jung-Joon Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/795,507

(22) Filed: Mar. 9, 2004

(30) Foreign Application Priority Data

Jun. 20, 2003 (KR) .................................. 10-2003-0040411

(51) Int. Cl.[7] .............................................. G01R 31/26
(52) U.S. Cl. ....................................... 324/765; 324/763
(58) Field of Search .................................. 324/763, 764, 324/765, 761, 759, 76.11, 601, 606, 672, 130; 438/122, 118

(56) References Cited

U.S. PATENT DOCUMENTS 6,184,659 B1 * 2/2001 Darmawaskita ............. 320/139
6,515,464 B1 * 2/2003 Darmawaskita et al. . 324/76.11

* cited by examiner

Primary Examiner—David Zarneke
Assistant Examiner—Trung Q. Nguyen
(74) Attorney, Agent, or Firm—Volentine Francos & Whitt, PLLC

(57) ABSTRACT

A ball grid array (BGA) package test module includes BGA packages, a module board, and test architecture for use in testing the BGA packages while they are mounted to the module board. The test architecture of the BGA package test module includes package test signal lines connected to solder balls of the BGA packages as extending along a bottom surface of the BGA packages, board test signal lines extending along the module board, and electrical junctions that interconnect the package and board test signal lines. Signals from the BGA packages can be picked up by the probe of a testing apparatus via the board test signal lines. The present invention is advantageous in that it minimizes the effect of stubbing by the test signal lines when the memory module is operating.

10 Claims, 7 Drawing Sheets

MODULE HAVING TEST ARCHITECTURE FOR FACILITATING THE TESTING OF BALL GRID ARRAY PACKAGES, AND TEST METHOD USING THE SAME

BACKGROUND OF THE INVENTION

1. Field of the Invention

The present invention relates to the testing of memory devices. More particularly, the present invention relates to a module that facilitates the testing of functional characteristics of ball grid array (referred to as BGA, hereinafter) packages, and to a test method using the same.

2. Description of the Related Art

A memory module provides the requisite information storage capacity of a computer. The memory module has a plurality of semiconductor memory devices soldered to a module board, which in turn is installed in a socket of the computer system. Ten or several tens of the memory devices are typically mounted on a single module board to thereby form the memory module. On the other hand, each memory device comprises a semiconductor package provided with a built-in memory chip, and external connection terminals coupled to the chip. Of these semiconductor packages, BGA packages, employing balls as the external connection terminals, are being used to meet the demand for smaller memory devices having larger numbers of input/outputs.

FIG. 1 illustrates a memory module 50 formed of a plurality of BGA packages 10 mounted on a module board. As shown in FIG. 1, the memory module 50 comprises a module board 51, BGA packages 10 arranged at a predetermined pitch along the module board 51, and a wire pattern 53 disposed on the module board 51. The wire pattern 53 may be formed on both sides of the module board 51, in which case the respective portions of the wire pattern 53 formed on both sides of the module board 51 are electrically coupled to each other through via holes 55. Alternatively, the wire pattern 53 may be disposed inside or on only one side of the module board 51.

The wire pattern 53 is composed of board pads 53a, tabs 53b, and a circuit pattern 53c. Each board pad 53a is located at a position where the ball (not shown) of the BGA package 10 is situated, i.e., the pads 53a are arranged in correspondence with the balls of the BGA package 10 so as to be electrically connected to the BGA package 10. The tabs 53b are connected to the board pads 53a by the circuit pattern 53c, and are spaced from one another at a predetermined pitch along the longer side of the module board 51. The tabs 53b are insertable into a socket of an external electronic system to provide an electrical interconnection between the memory module 50 and the external electronic system.

Characteristics of each BGA package 10 are typically tested by test apparatus that checks the waveforms of signals generated by the BGA package 10 while mounted on the module board 51. To this end, the test apparatus employs probe pins P fed through the via holes 55 from the side of the module board 51 opposite that on which the BGA package 10 is mounted. However, this type of probe-based test apparatus can obviously not be used to test a module 50 in which the BGA packages 10 are mounted on both sides of the module board 51.

One of the conventional ways to solve the limitations posed by the probe-based apparatus in testing a module having packages mounted to both sides of the module board is to provide contacts for the probe pins at the sides of the BGA package 10. That is, as shown in FIG. 2, additional test signal lines 57 extend from the board pads 53a on the module board 51, and probe pads 59 for contacting the probe pins of the test apparatus are formed at the ends of the test signal lines 57, respectively.

However, for accuracy, the actual signals generated by the BGA package 10 should be checked by the test apparatus at the external terminals of the package, i.e., at the solder balls of the BGA package 10. In the case of the module shown in FIG. 2, though, the signal may be distorted as it must travel the entire length of the test signal line 57 before being picked up by the test apparatus. Moreover, this solution may result in an impedance mismatch, a reflection of the signal, and electromagnetic incompatibility (EMI) due to stubbing with the additional test signal line 57. Still further, EMI is more likely to exist in high-frequency applications because in this case the test line inducing the stubbing disturbance acts as an antenna.

FIG. 3 illustrates another conventional module 50 in which the test points are located to the side of the BGA package 10 mounted on the module board 51. In this module, a test pad 61 for contacting a probe pin of the test apparatus is provided on the circuit pattern 53c through which signals in actual use travel. However, even though the structure shown in FIG. 3 is simple, differences still exist between the actual signals generated during a normal operating state of the memory module and the signals measured by the test apparatus at the test pads 61.

SUMMARY OF THE INVENTION

An object of the present invention is to solve the aforementioned problems of the prior art.

Accordingly, one object of the present invention is to provide a ball grid array package test module by which reliable test results for signals appearing at balls of a BGA package can be picked up, and which prevents distortions of actual drive signals.

Another object of the present invention is to provide a method of testing ball grid array packages mounted on a module board, which yields reliable test results for signals appearing at balls of a BGA package and prevents distortions of actual drive signals.

According to one aspect of the present invention, a ball grid array package test apparatus mounted on a module board includes: ball grid array (BGA) packages, a module board to which the BGA packages are mounted, and test architecture including package test signal lines extending along the bottom surface of each of the BGA packages, board test signal lines extending along a surface of the module board, and electrical junctions connecting the package and board test signal lines.

Each of the BGA packages includes a semiconductor chip mounted on a circuit board, and a plurality of solder balls arranged in a matrix on the bottom surface of the circuit board.

The package test signal lines are each connected to a respective one of the solder balls of the BGA package, and terminate at a location disposed outwardly of the matrix of solder balls of the BGA package. The board test signal lines correspond to the package test signal lines and each extend along the module board from a first position, juxtaposed with respect to the location at which the corresponding package test signal lines terminates, to a second position located to the side of the BGA package. The test architecture also preferably includes probe pads connected to ends of the board test signal lines at the second positions, respectively.

The distance between each probe pad and solder ball, which are connected through a package test signal line and a board test signal line, is preferably 5–10 mm.

The electrical junctions each include a package test pad connected to a package test signal line, a board test pad connected to a board test signal line, and a junction node interposed between the package test pad and the board test pad. The junction node is formed in the shape of a ball, and may be formed on either one of the package test pad and the board test pad. Also, the package test pads are disposed in conformity with the matrix of the solder balls, so as to have a spacing with the solder balls at a pitch corresponding to that of the solder balls.

According to another aspect of the present invention, a method of testing BGA packages comprises pre-forming package test signal lines on each of at least one BGA packages, providing a module board having the board test signal lines and probe pads on a surface of the board substrate thereof, mounting each BGA package to the module board while electrically connecting the test signal lines on the bottom surface of the BGA package to the board test signal lines, respectively, and subsequently inputting signals to the semiconductor chip of the BGA package via the module board, and placing the probe of a testing apparatus in contact with the probe test pads.

BRIEF DESCRIPTION OF THE DRAWINGS

These and other objects, features and advantages of the invention will be apparent from the detailed description of the preferred embodiments thereof, made with reference to the accompanying drawings. The drawings are not necessarily to scale, emphasis instead being placed on illustrating the principles of the invention. Also, in which like reference characters designate like parts through the drawings. In the drawings.

DETAILED DESCRIPTION OF THE PREFERRED EMBODIMENTS

A memory module having architecture dedicated for use in testing a BGA package mounted on a module board, and the method for testing the BGA package using such architecture, will now be described, with reference to FIGS. 4 through 6.

Figure 1:
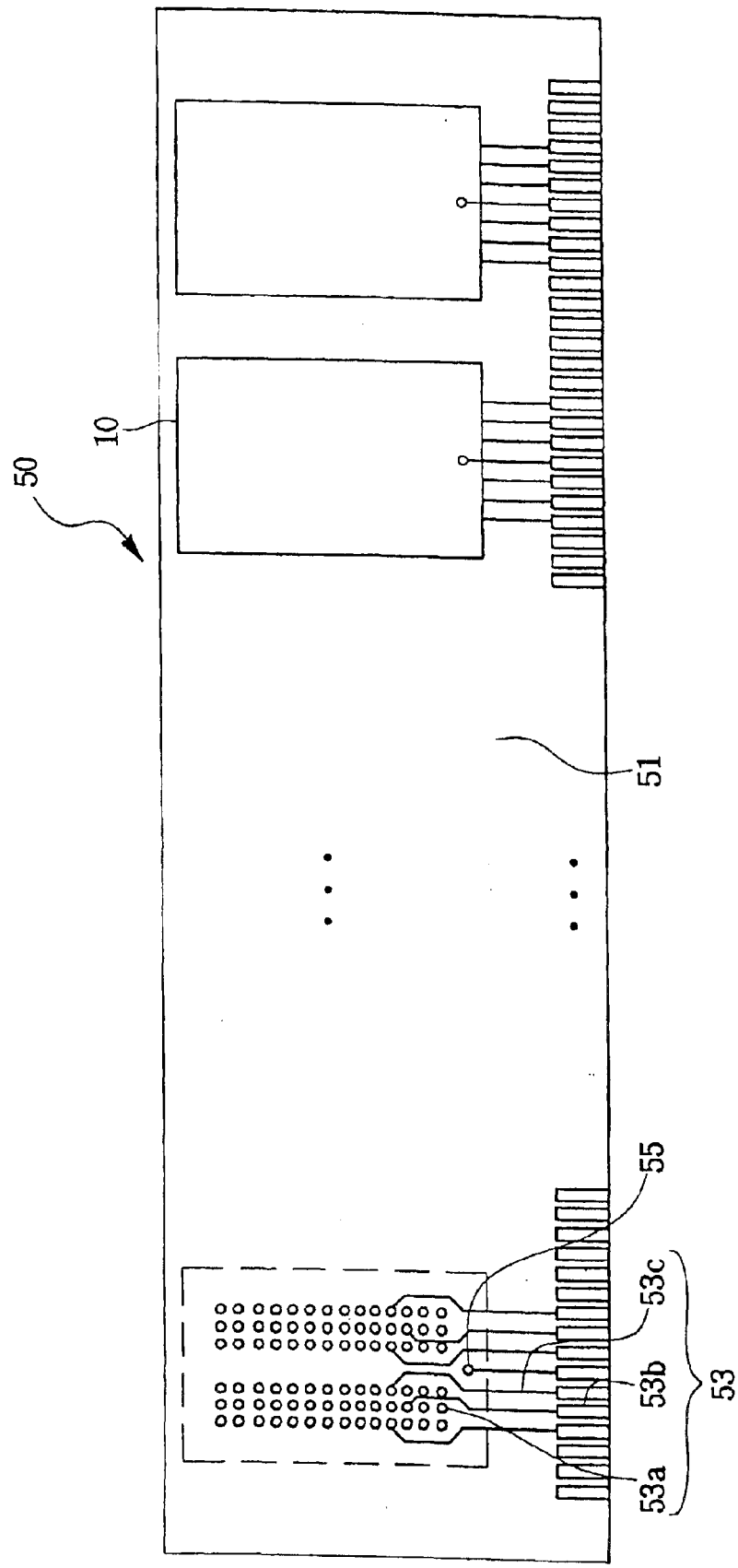
FIG. 1 is a plan view of a conventional memory module comprising a plurality of BGA packages mounted on a module board.
Figure 2:
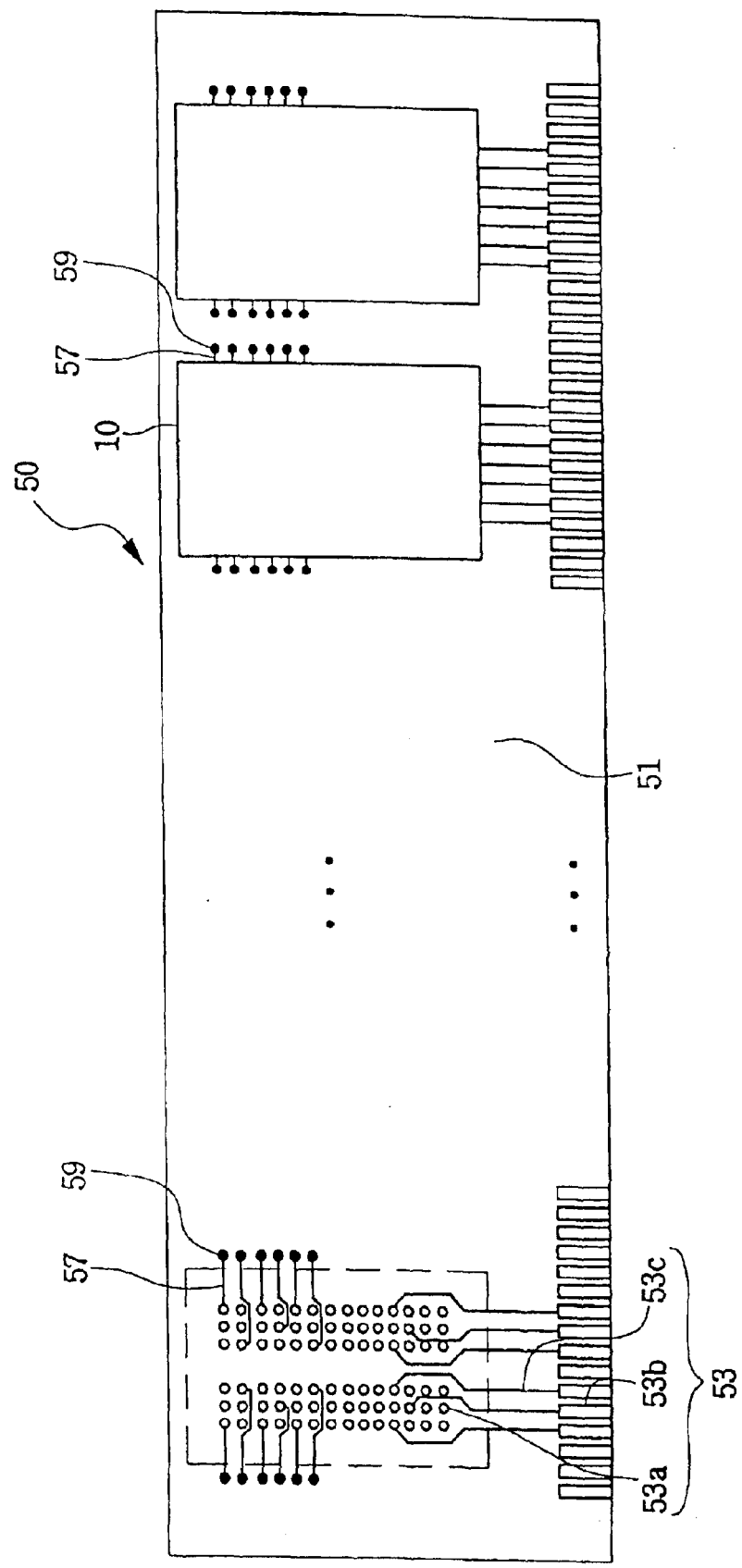
FIG. 2 is a plan view of a similar memory module, illustrating conventional architecture used to facilitate the testing of the BGA packages mounted on the module board.
Figure 3:
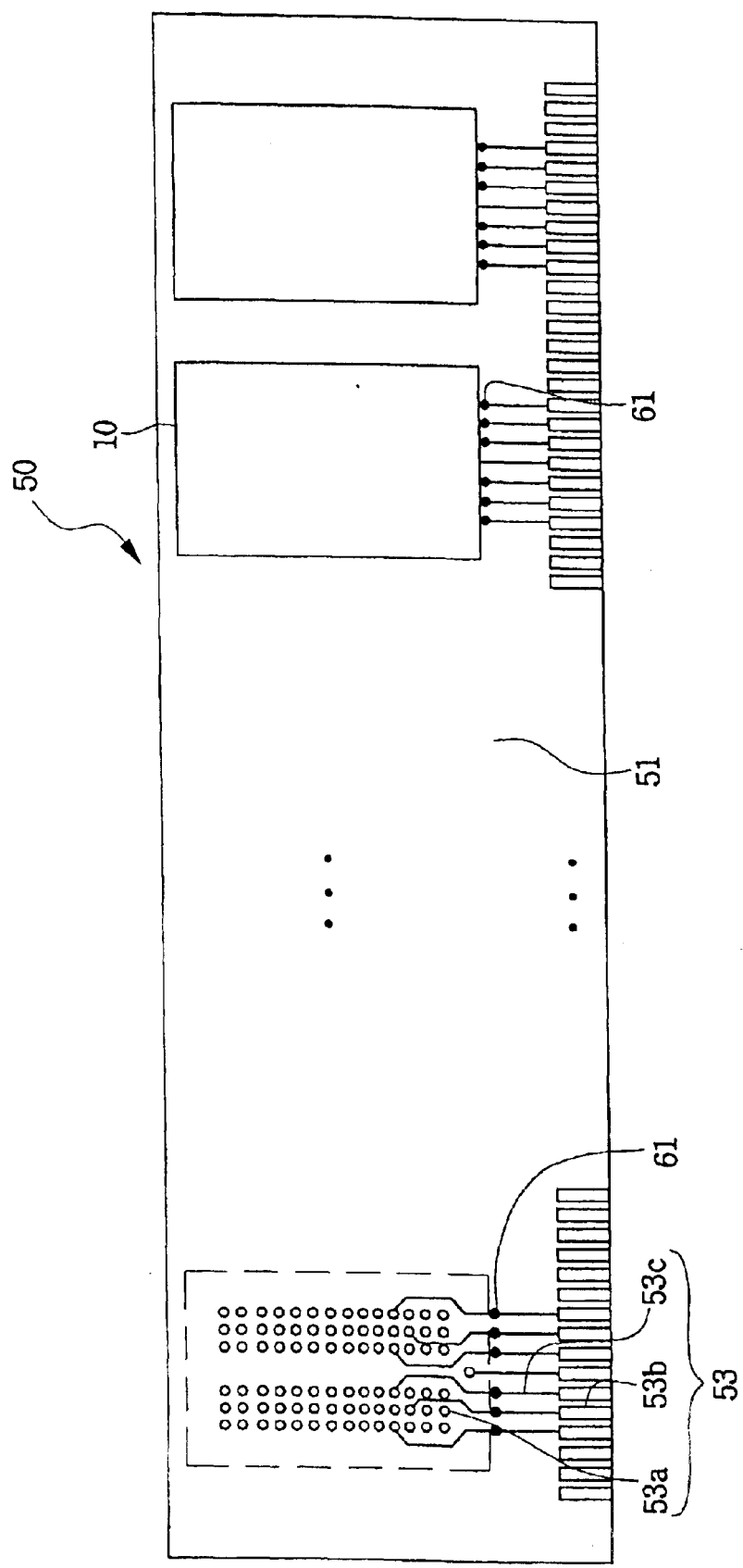
FIG. 3 is a plan view of still another module, illustrating another form of conventional architecture used to facilitate the testing of the BGA packages mounted on the module board.
Figure 4:
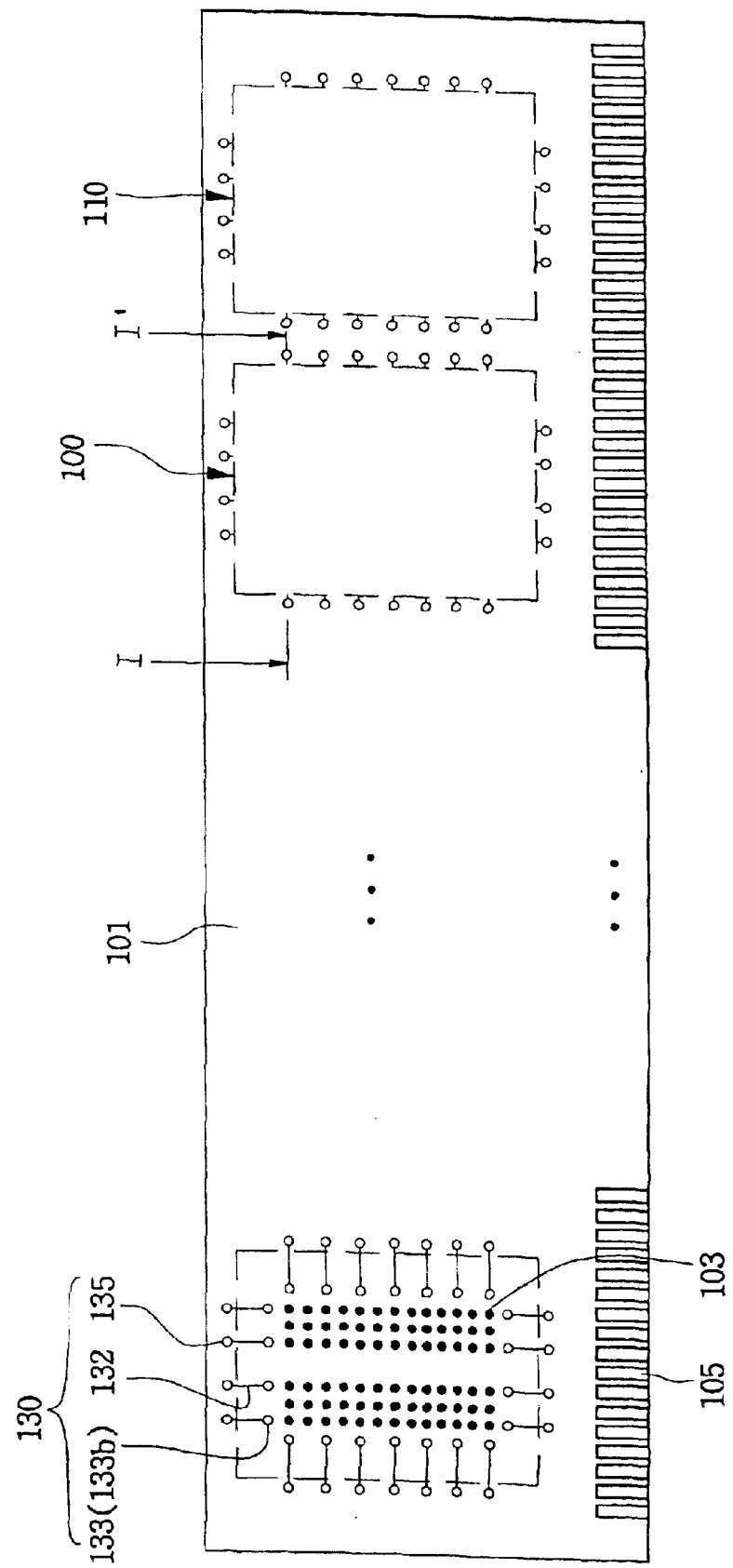
FIG. 4 is a plan view of a memory module having architecture for facilitating the testing of the BGA packages mounted on the module board, according to the present invention.

As shown in FIG. 4, the memory module 100 includes a number of BGA packages 110 mounted on a module board 101. The module board 101 has a board body or substrate, a plurality of board pads 103 connected to solder balls of the BGA packages 110, and tabs 105 arranged along the longer edge of the board body at a predetermined pitch and connected to the board pads 103. The tabs 105 are to be inserted into a socket of an external electronic system to electrically connect the memory module 100 with the external electronic system.

Figure 5:
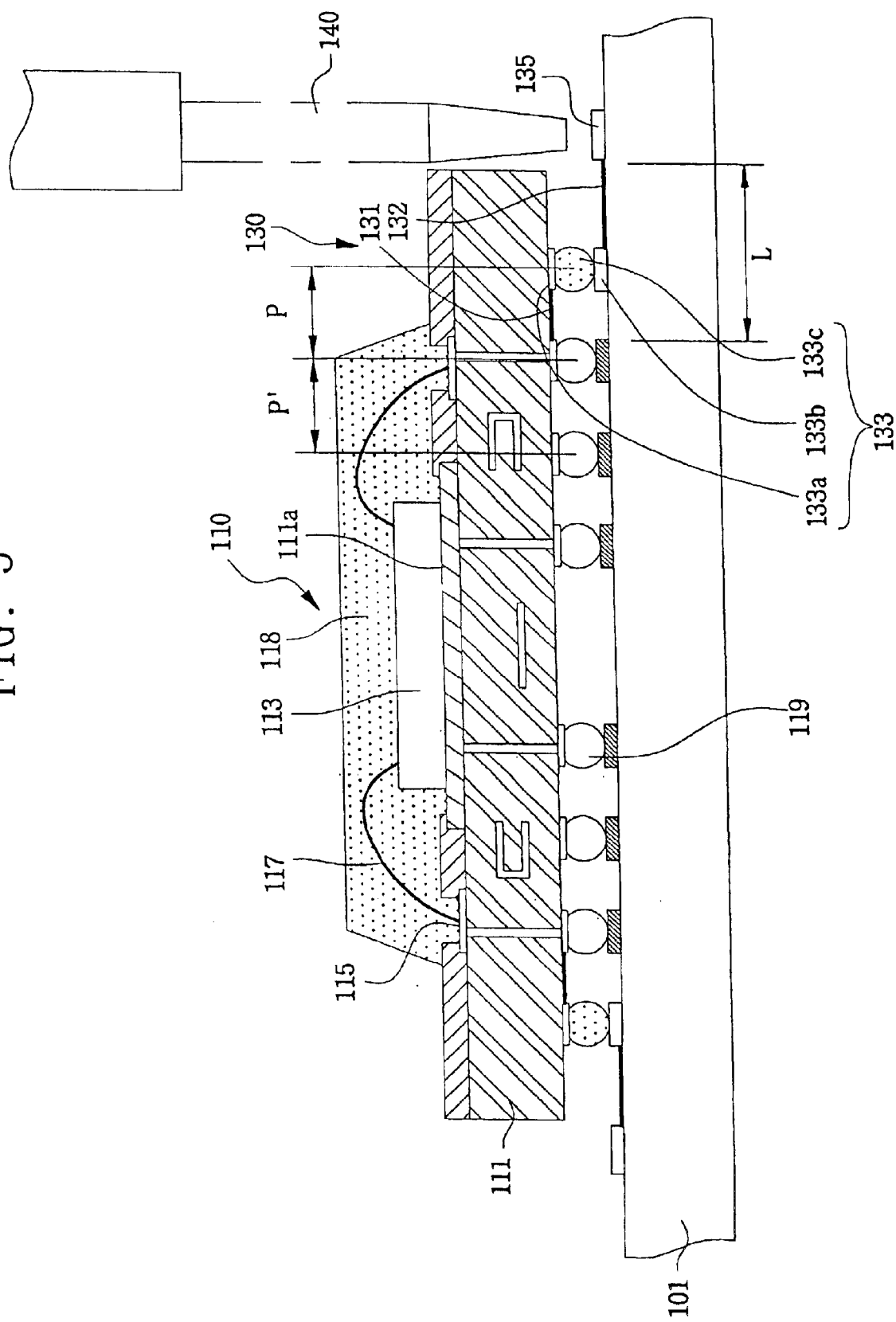
FIG. 5 is a sectional view of the module taken along line I–I' of FIG. 4.
Figure 6:
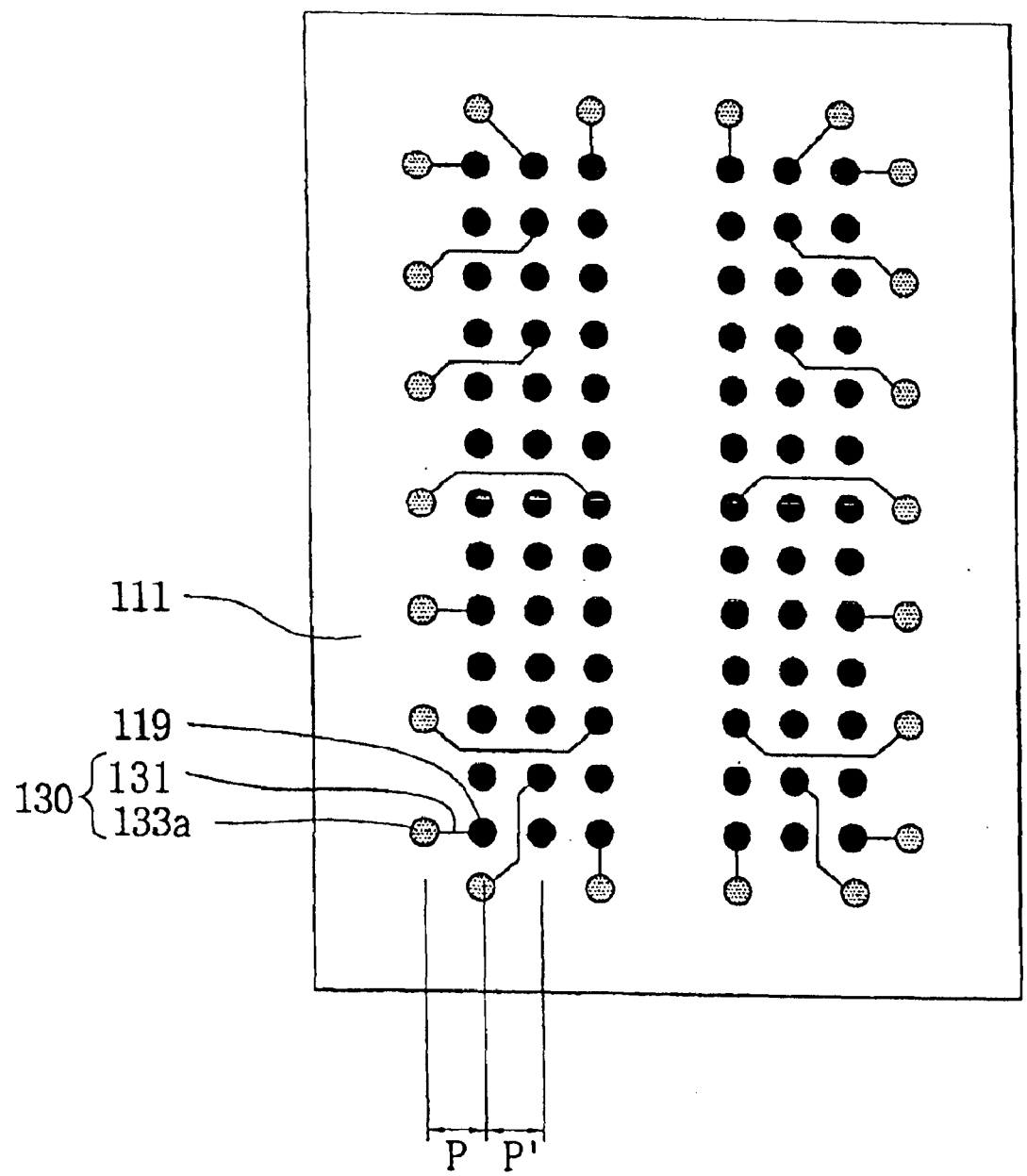
FIG. 6 is a bottom view of the BGA package shown in FIG. 4.

Each BGA package 110, as shown in FIG. 5, comprises a printed circuit board 111, a semiconductor chip 113 attached by conductive adhesive to a pad 111a at the upper surface of the printed circuit board 111, conductive material 115 electrically connecting the module board 101 and the semiconductor chip 113, a wire 117 connecting the semiconductor chip 113 and the conductive material 115, a package housing 118 protecting the conductive material 115 and the wire 117 on the upper surface of the semiconductor chip 113 and the printed circuit board 111, and a plurality of solder balls 119 adhered to the bottom surface of the printed circuit board 111 to be used as external leads. As shown in FIG. 6, the solder balls 119 are arranged in a matrix.

In order to test the operation of a BGA package 110 disposed on the module board 101, the module 100 is equipped with test architecture 130 connected to the BGA package 110 and the module board 101. The test architecture 130 includes package test signal lines 131, board test signal lines 132, and junction units 133. The package test signal lines 131 are connected to the plurality of solder balls 119 at locations to the side of the region in which the solder balls are arranged in a matrix, as shown in FIG. 5.

The board test signal lines 132 extend on the module board 101 from positions corresponding to the package test signal lines 131 to a region located laterally of (to the side of) the BGA package 110. The distal ends of the board test signal lines 132 are connected to probe pads 135 that are to be contacted by a probe pin 140 of a tester.

Each junction unit 133 includes a package test pad 133a connected to a package test signal line 131, a board test pad 133b connected to a board test signal line 132 at a position corresponding to the location of the package test pad 133a, and a junction node 133c interposed between the package test pad 133a and the board test pad 133b.

Preferably, the junction node 133c has the same shape as the solder balls 119 and is connected to one package test pad 133a and board test pad 133b. The junction node 133c contributes to minimizing the length of the test signal line which, if excessive, may disturb the condition of the signal at the solder ball 119 during a normal operating state of the memory module 100.

Preferably, the total length of the package test signal line 131 and the board test signal line 132, i.e., the length L between the solder ball 119 and the probe pad 135, is in the range of 5–10 mm. If the length L of the test signal lines are longer, the actual signal reflected from the solder ball 119 to be tested would produce interference that would prevent an accurate waveform from being picked up by the probe 140 of the test apparatus.

The package test pads 133a are preferably arranged to conform to the pattern of the matrix of the solder balls 119, i.e., the package test pads 133a maintain the same pitch P with the solder balls 119 as the pitch P' of the solder balls 119 themselves. As can be seen in best in FIG. 6, the matrix is such that respective groups of the solder balls 119 are each disposed in a line, and the location at which each of the package test signal lines 131 terminates is in line with a respective one of the groups of solder balls. Such a disposition of the package test pads 133a ensures that the length of the package test signal line 131, which is connected to the solder ball 119, can be kept to a minimum.

In testing the characteristics of the BGA package 110 having the structure described above, the junction node 133c contacts the board test pad 133b and the package test pad 133a, as shown in FIG. 5. Accordingly, the package test signal line 131 is connected to the board test signal line 132. In this state, the probe pin 140 is placed in contact with the probe pad 135 to measure a test signal transferred from the location of the solder ball 119.

Figure 7:
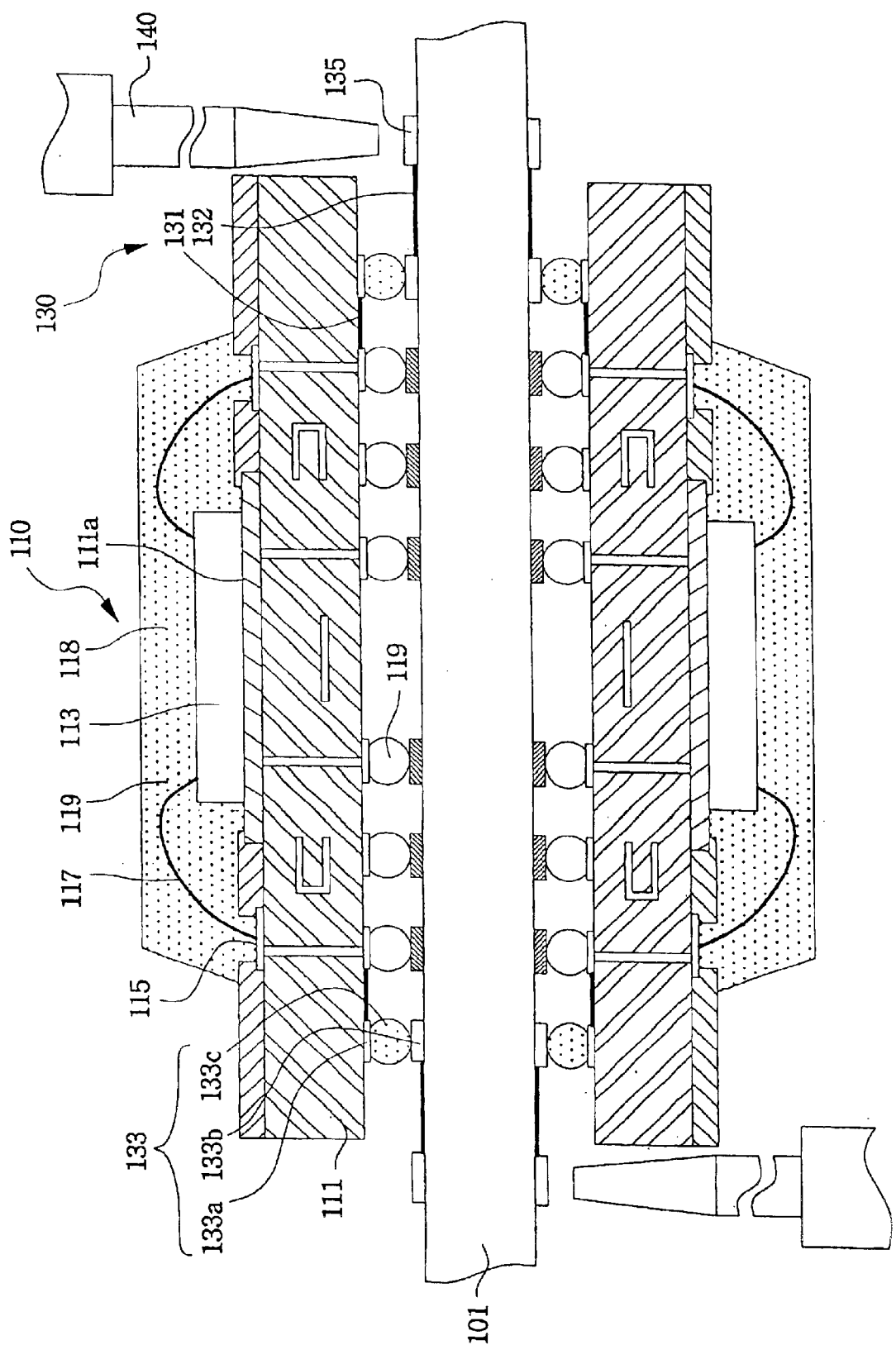
FIG. 7 is a sectional view illustrating an embodiment of a memory module in which BGA packages are provided on both sides of the module board according to the present invention.

FIG. 7 shows another embodiment in which a BGA package test can be conducted on both sides of the module board 101. As shown in FIG. 7, a probe pin 140 can effectively contact a test pad even though the BGA packages 110 are disposed on both sides of the module board 101.

According to the present invention as described above, test signal lines are directly connected to the solder balls of a BGA package.

Therefore, the test module allows the actual signals transferred to solder balls of the BGA package to be picked up by a probe, thereby facilitating an accurate testing of the BGA package.

Moreover, the flexible structure by which test signal lines are connected to the BGA packages minimizes stubbing effects during a normal operation of the memory module.

Although the preferred embodiments of the present invention have been described in detail above, those skilled in the art will appreciate that various modifications of additions to these preferred embodiments without departing from the true spirit and scope of the invention as defined by the appended claims.

What is claimed is:

1. A ball grid array package test module, comprising:
ball grid array (BGA) packages each including, a circuit board, a semiconductor chip mounted on the circuit board, and a plurality of solder balls arrayed in a matrix on a bottom surface of the circuit board;
a module board including module board substrate, and a plurality of board pads disposed on at least one side of the module board substrate, the BGA packages being mounted to said module board on at least one side of the module board substrate with each of said board pads contacting a respective one of the solder balls of the BGA packages; and
test architecture associated with each of said BGA packages, the test architecture including
package test signal lines each connected to a respective one of the solder balls of the BGA package, and extending along a bottom surface of the BGA package and terminating at a location disposed outwardly of the matrix of solder balls of the BGA package,
board test signal lines corresponding to said package test signal lines and each extending along said module board from a first position, juxtaposed with respect to a said location at, which one of the package test signal lines terminates, to a second position located to the side of the BGA package,
probe pads disposed on said module board at a said second position, and said probe pads connected ends of said board test signal lines, respectively, and
electrical junctions each connecting a corresponding pair of said package test signal and board test signal lines, each of said junctions extending between a said location at which the package test signal line of said pair terminates and a said first position from which the corresponding board test signal line extends.

2. The ball grid array package test module of claim 1, wherein each of the junctions comprises a package test pad connected to the package test signal line of said pair, a board test pad connected to the board test signal line of said pair and juxtaposed with respect said package test pad, and a junction node interposed between the package test pad and the board test pad.

3. The ball grid array package test module of claim 2, wherein said junction node has the shape of a ball.

4. The ball grid array package test module of claim 2, wherein said solder balls are spaced from one another in said matrix by a uniform pitch, and said package test pads are disposed in an arrangement conforming to the matrix of the solder balls so as to each be spaced from a respective one of the solder balls by said pitch.

5. The ball grid array package test module of claim 1, wherein the distance between each said probe pad and solder ball which are connected by a said pair of package test signal and board test signal lines, as taken along said module board, is 5–10 mm.

6. The ball grid array package test module as claimed in claim 1, wherein respective groups of the solder balls are each disposed in a line, and said location at which each of said package test signal lines terminates is in line with a respective one of the groups of solder balls.

7. A method of testing BGA packages, comprising:
providing at least one BGA package including a circuit board, a semiconductor chip mounted on the circuit board, and a plurality of solder balls arrayed in a matrix on a bottom surface of the circuit board;
providing a module board comprising a module board substrate;
providing test architecture for use in testing the BGA package, comprising forming package test signal lines on the bottom surface of the circuit board of the BGA package, each of the test signal lines electrically being connected to one of the solder balls and terminating at a location disposed outwardly of the matrix of solder balls, and providing a plurality of probe test pads on a surface of the module board substrate, and board test signal lines extending along said surface of the module board substrate, the board test signal lines being connected to the probe pads, respectively;
mounting the BGA package to the module board while electrically connecting the test signal lines on the bottom surface of the BGA package to the board test signal lines, respectively;
once the BGA package is mounted to the module board, inputting signals to the semiconductor chip of the BGA package via the module board, and placing the probe of a testing apparatus in contact with the probe test pads.

8. The method of testing BGA packages of claim 7, wherein said providing of test architecture further comprises forming a plurality of package test pads on the bottom surface of the circuit board of the BGA package at locations outwardly of the matrix of solder balls thereof, the package test signal lines electrically connecting the solder balls and the package test pads, and
providing a plurality of board test pads on the surface of the module board substrate, the board test signal lines electrically connecting the board test pads and the probe test pads, and wherein said mounting of the BGA package to the module board comprises electrically connecting the test signal lines to the board signal lines via the package test and board test pads.

9. The method of testing BGA packages of claim 8, wherein said providing of test architecture further comprises forming junction nodes on the package test pads, respectively, wherein said mounting of the BGA packages to the module board comprises setting said junction nodes on the board test pads.

10. The method of testing BGA packages of claim 9, wherein said forming of junction nodes on the package test pads comprises forming balls of electrically conductive material on the package test pads, respectively.

* * * * *